(12) United States Patent
Li et al.

(10) Patent No.: US 7,033,433 B2
(45) Date of Patent: Apr. 25, 2006

(54) CRYSTAL GROWTH METHODS

(75) Inventors: Qiao Li, Westborough, MA (US); William R. Rosch, Sturbridge, MA (US); Paul M. Schermerhorn, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/757,751

(22) Filed: Jan. 14, 2004

(65) Prior Publication Data

US 2004/0154527 A1 Aug. 12, 2004

Related U.S. Application Data

(60) Provisional application No. 60/442,194, filed on Jan. 24, 2003.

(51) Int. Cl.
*C30B 11/02* (2006.01)
(52) U.S. Cl. .............................. 117/2; 117/81; 117/82; 117/83; 117/942; 117/940
(58) Field of Classification Search ................. 117/81, 117/82, 83, 2, 940, 942
See application file for complete search history.

(56) References Cited

U.S. PATENT DOCUMENTS

| 6,332,922 | B1 | 12/2001 | Sakuma et al. ................ 117/3 |
| 6,350,310 | B1 * | 2/2002 | Gianoulakis ................ 117/2 |
| 6,377,332 | B1 * | 4/2002 | Sakuma et al. ................ 355/53 |
| 6,620,347 | B1 * | 9/2003 | Lo Iacono ................ 252/584 |
| 6,850,371 | B1 * | 2/2005 | Obara et al. ................ 359/649 |
| 2001/0019453 | A1 * | 9/2001 | Shiozawa ................ 359/641 |
| 2002/0038625 | A1 * | 4/2002 | Sakuma et al. ................ 117/84 |
| 2002/0066402 | A1 * | 6/2002 | Price ................ 117/81 |
| 2002/0185057 | A1 * | 12/2002 | Garibin et al. ................ 117/94 |
| 2003/0089307 | A1 * | 5/2003 | Wehrhan et al. ................ 117/200 |
| 2004/0099205 | A1 * | 5/2004 | Li et al. ................ 117/2 |

FOREIGN PATENT DOCUMENTS

WO    WO 01/73168 A1 * 10/2001

* cited by examiner

*Primary Examiner*—Robert Kunemund
*Assistant Examiner*—Matthew J. Song
(74) *Attorney, Agent, or Firm*—Walter M. Douglas

(57) ABSTRACT

The invention is directed to method of preparing metal fluoride single crystals and particularly to crystals where the metal is calcium, barium, magnesium or strontium, or a mixture thereof. The invention uses a decreasing fast cooling profile and an increasing slow cooling profile for the hot zone and the cold zone, respectively, after crystal formation during cooling from melt temperatures to a first temperature. A substantially constant cooling rate is then applied to the both zones during cooling from the first temperature to a final temperature, usually room temperature. It has been found that the substantially constant cooling rate during the annealing process results in crystals having improved homogeneity and birefringence.

7 Claims, 2 Drawing Sheets

CRYSTAL GROWTH METHODS

PRIORITY

This application claims the priority of U.S. Provisional Application No. 60/442,194, filed Jan. 24, 2003, and titled "CRYSTAL GROWTH METHODS".

FIELD OF THE INVENTION

This invention relates to crystal growth and annealing, and more specifically to methods for crystal growth and annealing that produce minimized residual stress and are suitable for production of calcium fluoride crystals.

BACKGROUND OF THE INVENTION

Metal fluoride crystals are used in various applications, for example, as optical elements in lithography equipment used in semiconductor processing. Semiconductor lithography equipment operating at 193 nm wavelengths commonly uses fused silica optical elements, but a limitation of fused silica is that it is damaged by high fluence at 193 nm. The next generation of semiconductor lithography is expected to use 157 nm wavelength illumination, and fused silica is quite opaque to 157 nm wavelength illumination.

Calcium fluoride is a candidate material for use in optical elements in 193 nm and 157 nm lithography equipment. However, current crystal growth and annealing processes lead to high residual stress in large calcium fluoride crystals, thus limiting the ability to produce calcium fluoride crystals suitable for optical lithography. High residual stresses in a crystal can cause it to exhibit a spatially varying index of refraction, which will be referred to herein as homogeneity or inhomogeneity (depending on use in context). Stresses can similarly cause the index of refraction to vary with polarization, an effect known as stress induced birefringence. When used in an optical system, these stress induced effects can lead to wavefront errors, image degradation and birefringence, all of which are detrimental to the effectiveness of an optical system using calcium fluoride optical elements.

Calcium fluoride crystal growth is typically done using the Bridgman or Bridgman-Stockbarger method. The process starts by placing a crucible of raw material into the hot zone of a furnace where the raw material is melted. The crucible is then slowly translated out of the hot zone and through a temperature gradient region where crystal growth occurs as the molten raw material cools below its melting point. Since crystal growth is not an isothermal process, thermal stress is induced in the growing crystal. The nature of the growth process makes it very difficult to achieve a good homogeneity and a low stress birefringence in the crystal.

As a result of the stresses introduced during crystal growth, "post-annealing" or "secondary annealing" is typically used to reduce the inhomogeneity and birefringence in $CaF_2$ crystals. However, a separate post-annealing process presents two major disadvantages. First, an extra furnace and process is required for post-annealing. This prolongs the total $CaF_2$ manufacturing time and increases costs. Second, post-annealing adds another opportunity to damage the crystal either due to contamination or any process failure. Consequently, efforts have been directed to the development of an "in situ" annealing/cooling procedure just after the growth so that a high-quality crystal with improved homogeneity and birefringence can be obtained in one furnace by one process. However, despite these efforts there is a need for further improvements in methods of producing crystals that minimize index inhomogeneity and birefringence in calcium fluoride and other metal fluoride crystals.

SUMMARY OF INVENTION

The invention is especially useful for large diameter crystals, for example, crystals having a diameter greater than about 200 mm, 250 mm or 300 mm. The crystals are cooled at a substantially constant rate during the annealing process. The process results in calcium fluoride crystals having an average birefringence of less than about 2 nm/cm and an average homogeneity of less than 2 ppm. In particularly preferred embodiments, the invention provides calcium fluoride crystals having diameters exceeding about 200 mm, 250 mm or 300 mm and having an average homogeneity less than about 1 ppm, a birefringence less than about 0.5 nm/cm and a wavefront exhibiting a reduced value of symmetric and non-symmetric aberrations. Single crystals of metal fluoride of general formula $MF_2$ such as calcium fluoride, barium fluoride, magnesium fluoride and strontium fluoride, and mixtures thereof, can be produced according to the invention.

Additional advantages of the invention will be apparent from the following detailed description. It is to be understood that both the foregoing general description and the following detailed description are exemplary and are intended to provide further explanation of the invention as claimed.

DETAILED DESCRIPTION

Figure 1:
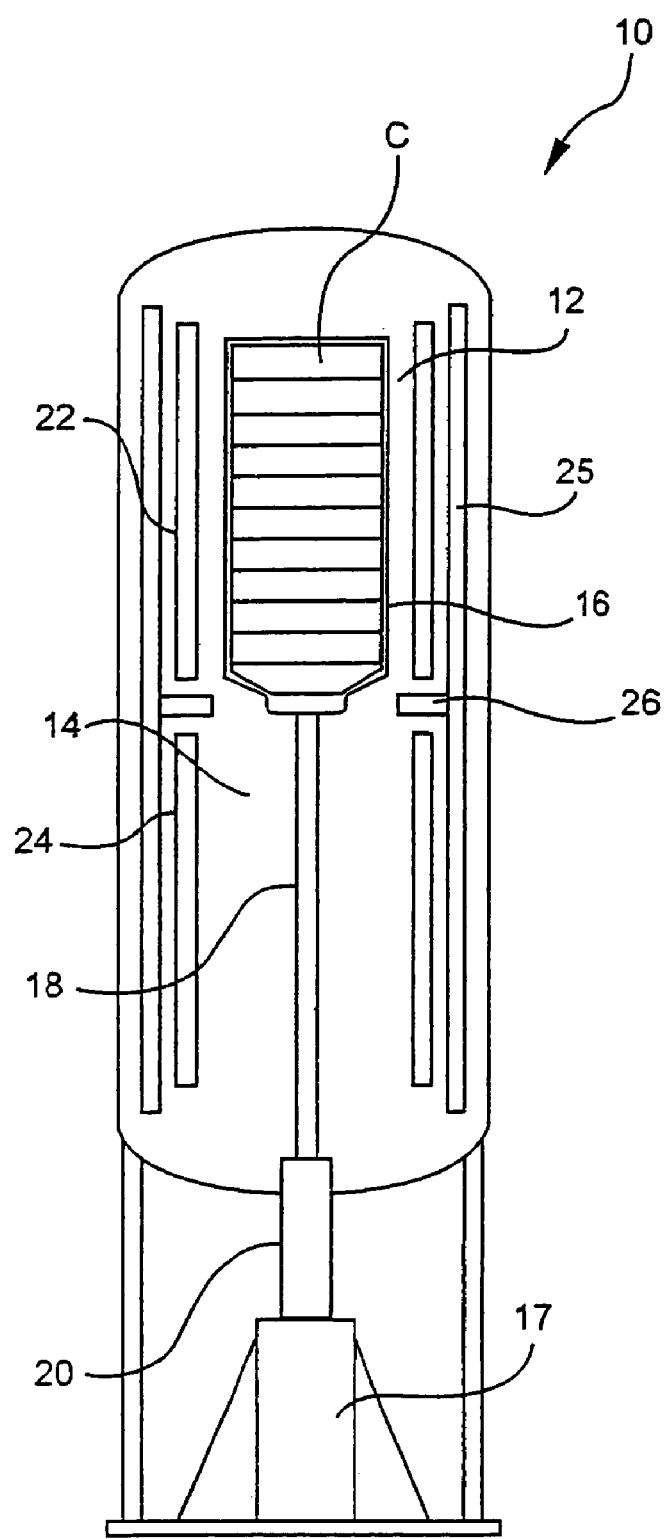
FIG. 1 shows a device for producing crystals according to an embodiment of the invention.

Before describing several exemplary embodiments of the invention, it is to be understood that the invention is not limited to the details of construction or method steps set forth in the following description. The invention is capable of other embodiments and of being practiced or carried out in various ways.

The present invention provides methods for crystal growth and annealing that minimizes residual stress and associated birefringence and inhomogeneity, such methods being suitable for producing calcium fluoride crystals. According to one embodiment, the method of the present invention maintains a substantially constant cooling rate during annealing. Applicants have discovered that maintaining a substantially constant cooling rate during annealing reduces residual stress and associated birefringence, and it also reduces inhomogeneity in calcium fluoride crystals.

A crystal can be grown from a melt of fluoride materials by slowly moving the melt from a melting zone into a cooling zone so that crystal growth occurs. As the melt is moved the temperature difference between the zones during growth should be in the range of about 2° C./cm to about 8° C./cm, and preferably in the range of about 3° C./cm to 6° C./cm. During annealing the crystal is cooled from the growth temperature and eventually to room temperature. Typically, annealing processes use multiple cooling rates in different temperature ranges to achieve a time-efficient annealing cycle. This multiple cooling rate approach is based on the belief that the crystal reacts differently to temperature changes in different temperature ranges, and therefore the cooling rate should be adjusted accordingly to deliver the best annealing result. For example, a typical annealing cycle in a post-annealing furnace is disclosed in U.S. Pat. No. 6,332,922 and consists of a slow cooling rate in the upper portion of the cycle (1.2° C./hour between about 1080° C. to about 750° C.), an increased cooling rate in the middle portion of the cycle (2° C./hour between about 750° C. to about 500° C.), and still a faster cooling rate in the final portion of the cycle (5° C./hour between about 500° C. to about 20° C.). U.S. Pat. No. 6,332,922 reports that a birefringence of less than 2 nm/cm and an inhomogeneity of less than 2 ppm can be obtained for parts with a diameter of greater than 200 mm by this annealing cycle.

However, when this conventional, multiple cooling rate annealing approach is utilized in a growth furnace for annealing $CaF_2$ crystals, it is not as effective as when it is performed in the post-annealing furnace. The multiple cooling rate process in the growth furnace is unstable and sensitive to any disturbance, and the homogeneity and birefringence of crystals treated under the same process conditions vary widely with large standard deviations. Even if a desirable annealing profile can be identified for utilizing multiple cooling rates, it would be challenging to smoothly transition the multiple cooling rate cycles together without introducing any disturbance to the crystal. In addition, the optimal cooling profile/rate for a specific temperature segment can be different due to run-to-run and furnace-to-furnace variations, and it is very difficult to develop a universal process for all equipment configurations.

Applicants have discovered an improved annealing approach to overcome the above-described problems presented by conventional multiple cooling rate annealing methods for $CaF_2$ crystals. One aspect of the invention provides an in-situ annealing process in the growth furnace for crystals, and in particular, <111>- and <100>-grown calcium fluoride crystals so a highly homogenous index of refraction and low stress birefringence can be obtained. According to another aspect of the invention, a stable annealing/cooling process is provided that can consistently deliver an acceptable annealing result even with equipment and operation variability. In still another aspect of the invention, cooling conditions are provided that are specifically suitable for a post-grown crystal in a growth furnace so that the stress induced birefringence and the defects generated during the growth can be minimized/or eliminated.

In contrast with conventional multiple cooling rate approaches, the method suggested here pursues a linear or substantially constant cooling rate approach. A single cooling rate avoids rate change points that could have negative impact on the crystal. Furthermore, the simplicity of the linear or constant rate cooling profile promotes more stable furnace performance, permitting more consistent results from run to run. Since a substantially constant cooling rate approach treats every temperature regime equally, the temperature shift or fluctuation in the crystal due to the equipment and operation variations will not have as much impact on the crystal as the multiple-cooling rate approach. Thus, a substantially constant cooling rate procedure is more robust to the equipment and operation noises/variations and, therefore, is able to deliver more consistent results.

According to the present invention, the $CaF_2$ crystal growing process is modified to include a constant rate cooling cycle after the crystal is cooled to a first temperature. The first temperature is preferably set in a range of about 1300° C. to 1100° C., and preferably from about 1250° C. to 1150° C. According to one embodiment, a pretreated $CaF_2$ material is loaded into a graphite crucible with a <111> or <100> seed crystal in the seed crystal holder in the crucible bottom. The crucible is placed in a Bridgman-Stockbarger furnace with two separately controlled heaters, a first heater for a hot zone and a second heater for a cold zone.

FIG. 1 shows an example of a furnace 10 according to an embodiment of the invention. The furnace 10 includes a melting chamber 12 and an annealing chamber 14. Inside the melting chamber 12 is a stack of crucibles 16. In the illustration, the melting chamber 12 and annealing chamber 14 are built such that they can accommodate one or more vertically-stacked crucibles or crystal growth chambers. Returning to FIG. 1, the melting chamber 12 and annealing chamber 14 are built such that up to 10 crucibles can be stacked vertically inside them. In general, the melting and annealing chambers 12, 14 can be built to accommodate crucibles in a range from 1 to 20.

A lift mechanism 17 is coupled to the stack of crucibles 16 to lower the stack of crucibles 16 from the melting chamber 12 into the annealing chamber 14. For example, the lift mechanism 17 could be a rod 18 coupled to a hydraulic, pneumatic or mechanical actuator 20. The actuator 20 may be controlled as necessary to translate the stack of crucibles 16 inside the furnace 10. The melting chamber 12 and the annealing chamber 14 have associated heating elements 22 (to provide a hot zone), 24 (to provide a relatively "cold zone") for maintaining an appropriate treatment temperature inside them. Insulating material 25 is provided around the heating elements 22, 24 to contain heat in the furnace 10. A temperature gradient between the melting chamber 12 and the annealing chamber 14 is obtained by a diaphragm 26 which partially isolates the melting chamber 12 from the annealing chamber 14. It should be noted that the heating element 24 in the annealing chamber 14 is optional. In addition, the heating element 24 does not have to extend across the entire length of the annealing chamber 14; i.e., a short heater can be used in the annealing chamber 14, just below the diaphragm 26.

Figure 2:
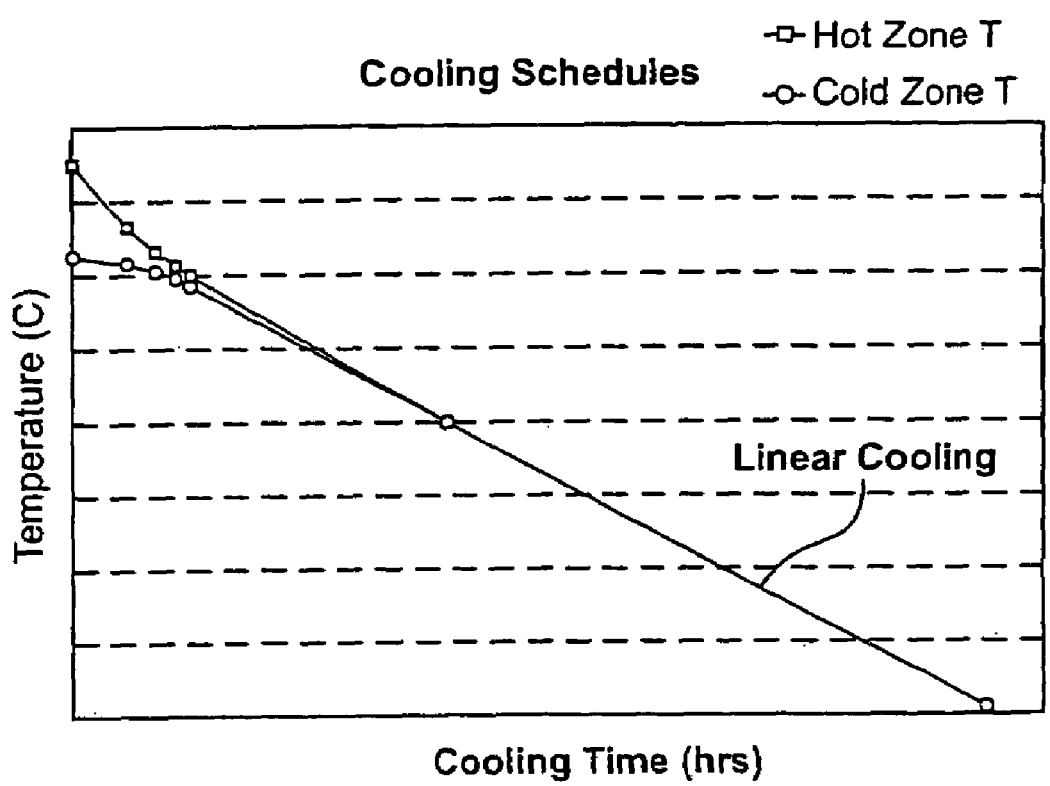
FIG. 2 is a graph of an annealing and cooling profile for a calcium fluoride crystal according to one embodiment of the invention.

Crystal growth occurs by pulling the crucible from the hot zone to the cold zone. According to one embodiment, after the growth crucible is fully inside the cold zone, the cooling (in-situ annealing) process is initiated by lowering the temperatures of the hot zone and the cold zone. According to one embodiment of the present invention two temperature regimes are used to cool the crystal. The first temperature regime is between the melting temperature (approximately 1420° C.) and approximately 1200° C. In this temperature regime and as shown in FIG. 2, a decreasingly fast cooling profile and an increasingly slow cooling profile are applied to the hot zone and cold zone, respectively, to reduce/diminish the temperature difference between the hot zone and the cold zone which is required for the crystallization. This temperature difference is preferably less than 50° C., and more preferably less than 30° C., at the first temperature. This step is designed to minimize the temperature gradient in the cold (annealing) zone as early (at as high a temperature) as possible. Both cooling curves should be as smooth as possible to avoid any undesirable thermal disturbance. After this primary cooling stage, a substantially constant cooling rate is applied to the both zones from the first temperature (in a range of about 1300° C. to 1100° C., preferably from about 1250° C. to 1150° C. to approximately a final temperature between about 300° C. and 20° C. and more preferably to about room temperature. This substantially constant cooling rate can be set at different values depending on the diameter of the crystal and the specification requirements for homogeneity and the birefringence as well as the furnace characteristics/or performance. Generally speaking, a larger diameter crystal and/or tighter specifications require a slower cooling rate, which results in a longer annealing cycle.

For crystals with a diameter greater than 250 mm, it has been demonstrated that desirable homogeneity (average of less than about 1.5 ppm) and birefringence (an average of less than about 0.6 nm/cm) can be achieved for <111> single crystals by using a cooling rate of less than about 3° C./hr. A cooling rate of less than about 2° C./hr is particularly preferred to obtain further improved homogeneity and birefringence for larger <111> or <100> crystals.

In particularly preferred embodiments, the invention provides calcium fluoride crystals having diameters exceeding about 200 mm, 250 mm or 300 mm and having an average homogeneity less than about 1 ppm, an average birefringence less than about 0.3 nm/cm and a wavefront exhibiting a reduced value of symmetric and non-symmetric aberrations. Aberrations are errors in an optical system, for example, a lens barrel, whereby a perfect image is not formed. Typical low order aberrations include spherical aberrations, astigmatism, and coma. Higher order aberrations are also present and include, but are not limited to third order aberrations and Seidel residual aberrations. When aberrations are present in a lens system, the waves converging on an image point are deformed from the ideal shape. The index variation in $CaF_2$ crystals are one source of aberrations. Typically symmetric (focus) or low order aberrations can be corrected by changing the surface figure of a lens. Non-symmetric aberrations, however, are not easily corrected.

Without intending to limit the invention in any manner, certain embodiments of the present invention will be more fully described by the following example.

EXAMPLE

Experiments were carried out in a Bridgman-Stockbarger furnace for growing crystals having a <111> or a <100> orientation using two different annealing approaches. One annealing approach was the conventional multiple cooling rate method and the other was the substantially constant cooling rate approach according to the present invention. The experiments used equivalent heating-up profile and the growth conditions. The only difference between the two experiments was in the cooling portion of the processing. Actual experiments for the invented linear annealing profile were performed at a cooling rate of approximately 2° C./hr.

The conventional process consisted of a rapid cooling rate in the upper portion of the cycle (approximately 6° C./hour between about 1500° C. to about 1100° C.), a slow cooling rate in the middle portion of the cycle (1.5° C./hour between about 1100° C. to about 750° C.), an increased cooling rate of about 5° C./hour between about 750° C. and about 450° C., and an even faster cooling rate in the final portion of the cycle, (approximately 10° C./hour between about 450° C. to about 20° C.). Both cooling schedules started at the equivalent temperatures of about 1500° C. for the hot zone and about 1250° C. for the cold zone. The results of homogeneity and birefringence measured on more than 100<111>-oriented crystals from the conventional annealing procedure and more than 10<111>-oriented crystals from the substantially constant cooling process according to the present invention are listed in Table 1. Based on average values of the tested crystals, the new profiles showed significant improvement in both homogeneity and birefringence. The substantially constant annealing process yielded a much smaller standard deviation in both homogeneity and birefringence measurement, which is a strong indication that the present invention provides a much more stable process and can deliver more consistent results. Homogeneity was measured using a Zygo XP phase shifting interferometer at a wavelength of approximately 632.8 nm. Birefringence was measured using a HINDS Exicor 450AT photo-elastic modulator instrument at a wavelength of about 632.8 nm.

TABLE 1

Homogeneity and Birefringence Results for <111> crystals (Clear Aperture: ~300 mm)

|  | Homogeneity (ppm) | | Birefringence (nm/cm) | |
| --- | --- | --- | --- | --- |
|  | Conventional | Linear | Conventional | Linear |
| Ave. | 1.41 | 0.85 | 0.58 | 0.32 |
| Std. Dev. | 0.61 | 0.35 | 0.25 | 0.06 |

A comparison was also made for <100>-grown crystals treated by the conventional multiple cooling rate annealing method and the substantially constant cooling rate annealing approach of the present invention. The data listed in Table 2 shows the improvement of the present invention over the conventional process. Compared to the conventional annealing method, substantially constant rate annealing process greatly reduces the birefringence and inhomogeneity. The homogeneity and birefringence measurements were taken in the same manner as the data reported in Table I.

TABLE 2

Homogeneity and Birefringence Results for <100> crystals (Clear Aperture: ~300 mm)

|  | Homog (ppm) | | Biref. (nm/cm) | |
| --- | --- | --- | --- | --- |
|  | w/Power | w/o Power | Mean | RMS |
| Conventional | 3.66 | 3.5 | 8.15 | 12.50 |
| Linear | 1.11 | 1.12 | 1.22 | 1.83 |

The Example demonstrates that the annealing method of the present invention enables not only an improvement with regard to homogeneity and birefringence, but also a more stable process that can consistently deliver improved crystals. The annealing process of the present invention has also been proven to effectively improve the quality of $CaF_2$ crystals having different crystallographic orientations, such as <111>, <100> and <110>. For <100> crystals, the method is capable of producing crystals having homogeneity of less than about 1.5 ppm and birefringence of less than about 2 ppm. The process of the present invention is simple and easy to adjust for different crystal sizes and requirements.

After the crystal is completely cooled to room temperature a blank is produced from the crystal. The blank can then be ground and polished to produce an optical element such as a lens, tube, or plate.

Table III reports the average aberrations (both low and high order) for 9 $CaF_2$ samples produced utilizing linear and 9 samples produced utilizing conventional annealing; according to the description above. Table III clearly reports that the average low order and high order aberrations value (250 nm aperture) exhibited by those $CaF_2$ crystals formed utilizing the linear annealing is much low than that exhibited by the $CaF_2$ crystals formed utilizing conventional annealing.

TABLE III

| | 250 mm Aperture | | | | | | | |
|---|---|---|---|---|---|---|---|---|
| | PV (ppm) | PV − PWR (ppm) | RMS (ppm) | Seidel Focus (ppm) | Seidel Ast (ppm) | Seidel Coma (ppm) | Seidel SA3 (ppm) | Seidel Residual RMS (ppm) |
| Conventional Avg: | 1.699 | 0.961 | 0.310 | 1.474 | 0.104 | 0.275 | 0.594 | 0.087 |
| Linear Avg: | 0.879 | 0.710 | 0.111 | 0.451 | 0.137 | 0.187 | 0.317 | 0.049 |

It will be apparent to those skilled in the art that various modifications and variations can be made to the present invention without departing from the spirit or scope of the invention. Thus, it is intended that the present invention cover modifications and variations of this invention provided they come within the scope of the appended claims and their equivalents.

What is claimed is:

1. A method of manufacturing a fluoride crystal comprising:
   heating a fluoride starting material in the melting zone of a growth furnace having a melting zone and a cooling zone to a temperature equal to or greater than its melting temperature to form a melt;
   growing a fluoride crystal from the fluoride melt by cooling the melt from the melting temperature to a first temperature below the melting temperature by lowering the melt from the melting zone into the cooling zone and controlling the temperature of the two zones so that the temperature difference between the two zones is less than 50° C. during crystal formation; and
   annealing the crystal in the cooling zone by cooling the crystal from the first temperature to a final temperature at a substantially constant cooling rate of 3° C./hour or less;
   wherein the fluoride starting material is selected from the group consisting of calcium fluoride, barium fluoride, magnesium fluoride and strontium fluoride, including mixtures thereof, and
   wherein during cooling from the melt temperature to the first temperature a decreasing fast cooling profile is applied to the melting zone and an increasingly slow cooling profile is applied to the growth/annealing zone to diminish the temperature difference between the two zones.

2. The method according to claim 1, wherein the starting material is calcium fluoride.

3. The method according to claim 1, wherein the first temperature is the range of 1300° C. to about 1100° C.

4. The method according to claim 1, wherein during crystal growth and cooling to a first temperature the temperature difference between the two zones is less than 30° C.

5. The method according to claim 1, wherein the final temperature is the range of 300° C. to approximately room temperature.

6. The method according to claim 1, wherein said method produces a <111> calcium fluoride single crystal having a diameter of 250 mm or greater with an average homogeneity of less than about 1.5 ppm and a birefringence of less than about 0.4 nm/cm.

7. The method according to claim 1, wherein said method produces a <111> calcium fluoride single crystal having a diameter of 250 mm or greater with an average homogeneity of less than about 0.9 ppm and a birefringence of less than or equal to about 0.32 nm/cm.

* * * * *